(12) United States Patent
Han

(10) Patent No.: US 11,710,642 B2
(45) Date of Patent: Jul. 25, 2023

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Qinghua Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 96 days.

(21) Appl. No.: 17/456,064

(22) Filed: Nov. 22, 2021

(65) Prior Publication Data

US 2022/0310400 A1  Sep. 29, 2022

Related U.S. Application Data

(63) Continuation of application No. PCT/CN2021/112300, filed on Aug. 12, 2021.

(30) Foreign Application Priority Data

Mar. 23, 2021  (CN) .......................... 202110310445.X

(51) Int. Cl.
  *H01L 21/308* (2006.01)
  *H01L 29/66* (2006.01)
  *H01L 29/78* (2006.01)

(52) U.S. Cl.
  CPC .... *H01L 21/3086* (2013.01); *H01L 29/66568* (2013.01); *H01L 29/78* (2013.01)

(58) Field of Classification Search
  CPC ............... H01L 29/78; H01L 29/66568; H01L 21/3086

(Continued)

(56) References Cited

U.S. PATENT DOCUMENTS 5,899,717 A    5/1999  Jun
6,787,469 B2   9/2004  Houston et al.
(Continued)

FOREIGN PATENT DOCUMENTS

CN    101055842 A    10/2007
CN    101246305 A    8/2008
(Continued)

OTHER PUBLICATIONS

International Search Reportas cited in PCT/CN2021/112300 dated Dec. 28, 2021, 9 pages.

(Continued)

*Primary Examiner* — Monica D Harrison
(74) *Attorney, Agent, or Firm* — Cooper Legal Group, LLC

(57) ABSTRACT

Embodiments of the present application provide a semiconductor structure and a manufacturing method thereof. The semiconductor structure manufacturing method includes: providing a base substrate and an array region, the array region being composed of strip structures arranged in parallel, the base substrate being made of a same material as the array region, and a thickness of the base substrate being greater than a thickness of the array region; etching the strip structure to form discrete first strip structures; base substrate providing a second mask layer, an opening pattern of the second mask layer exposing the to-be-etched region and the side plane, and a right angle being formed between an orthographic projection of the side plane and the opening pattern; form a first active region, the first active region having a mapping right angle corresponding to the right angle.

19 Claims, 6 Drawing Sheets

(58) Field of Classification Search
USPC .......................................................... 257/288
See application file for complete search history.

(56) References Cited

U.S. PATENT DOCUMENTS

| | | | |
|---|---|---|---|
| 2002/0000603 A1 | 1/2002 | Sakakibara | |
| 2004/0188745 A1 | 9/2004 | Kim | |
| 2004/0235255 A1 | 11/2004 | Tanaka et al. | |
| 2005/0173750 A1 | 8/2005 | Park | |
| 2009/0001482 A1 | 1/2009 | Kang | |
| 2010/0155959 A1 | 6/2010 | Park et al. | |
| 2013/0196477 A1 | 8/2013 | Kang | |
| 2014/0138690 A1 | 5/2014 | Ota et al. | |
| 2014/0328125 A1* | 11/2014 | Min | H10B 41/50 365/185.11 |
| 2017/0025420 A1 | 1/2017 | Park et al. | |
| 2020/0251337 A1 | 8/2020 | Chen et al. | |

FOREIGN PATENT DOCUMENTS

| | | |
|---|---|---|
| CN | 101335269 A | 12/2008 |
| CN | 101764122 A | 6/2010 |
| CN | 103247577 A | 8/2013 |
| CN | 104698747 A | 6/2015 |
| CN | 104867816 A | 8/2015 |
| CN | 105336667 A | 2/2016 |
| CN | 105977201 A | 9/2016 |
| CN | 110875313 A | 3/2020 |
| CN | 210607188 U | 5/2020 |
| CN | 111524794 A | 8/2020 |
| CN | 113078057 A | 7/2021 |
| EP | 3493825 B9 | 8/2020 |
| HR | P20200948 T1 | 12/2020 |
| WO | 2014181815 A1 | 11/2014 |

OTHER PUBLICATIONS

First Office Action of the Chinese application No. 202110310445.X, dated May 31, 2022, 8 pages.
Notice of Allowance of the Chinese application No. 202110310445.X, dated Jul. 4, 2022, 6 pages.

* cited by examiner

SEMICONDUCTOR STRUCTURE AND MANUFACTURING METHOD THEREOF

CROSS-REFERENCE TO RELATED APPLICATIONS

This application is a continuation application of International Patent Application No. PCT/CN2021/112300, filed on Aug. 12, 2021, which claims priority to Chinese Patent Application No. 202110310445.X, filed with the Chinese Patent Office on Mar. 23, 2021 and entitled "SEMICONDUCTOR STRUCTURE AND MANUFACTURING METHOD THEREOF". International Patent Application No. PCT/CN2021/112300 and Chinese Patent Application No. 202110310445.X are incorporated herein by reference in their entireties.

TECHNICAL FIELD

Embodiments of the present application relate to the field of semiconductors, and in particular, to a semiconductor structure and a manufacturing method thereof.

BACKGROUND

In a prior art, structures of different regions are generally manufactured and formed through independent process steps, and in order to reduce manufacturing costs, the structures of a same region are generally formed by one-time etching of a single mask.

However, with an increasingly-miniaturized integrated circuit, a size of an opening pattern of the mask gradually decreases. In a process step of performing etching by using the opening pattern of the mask, the pattern mapped on a target film layer may undergo distortion. A type of the distortion includes contraction of a right angle into a fillet. The distortion may lead to degradation of performance of a semiconductor structure.

SUMMARY

The embodiments of the present application provide a semiconductor structure and a manufacturing method thereof, which can reduce manufacturing costs and can also form an active region structure with a right angle.

According to some embodiments, in a first aspect, the present application provides a semiconductor structure manufacturing method, including: providing a base substrate and an array region, the array region being composed of a plurality of strip structures arranged in parallel, the base substrate being made of a same material as the array region, a top surface of the base substrate being parallel to a top surface of the array region, and in a direction perpendicular to the top surface of the base substrate, a thickness of the base substrate being greater than a thickness of the array region; etching the strip structure to form a plurality of discrete first strip structures; in a same process step of etching the array region, etching some thickness of the base substrate to form a first mask structure, the first mask structure being located on the remaining base substrate, the first mask structure having a side plane, and the side plane being perpendicular to a to-be-etched region of the remaining base substrate; providing a second mask layer, in a direction perpendicular to a top surface of the second mask layer, an opening pattern of the second mask layer exposing the to-be-etched region and the side plane, and in a plane where a top surface of the first mask structure is located, at least one right angle is formed between an orthographic projection of the side plane and an orthographic projection of the opening pattern of the second mask layer; etching, by using the second mask layer and the first mask structure as a mask, the to-be-etched region to form a first active region, the first active region having a mapping right angle corresponding to the right angle; and etching the first strip structure to form a plurality of discrete second strip structures, the second strip structures constituting a second active region.

According to some embodiments, in a second aspect, the present application provides a semiconductor structure, including: a first active region and a second active region, the first active region being made of a same material as the second active region, the first active region having a mapping right angle, the second active region being composed of a plurality of second strip structures arranged in an array, extension directions of at least four of the second strip structures overlapping with one another, and extension directions of at least two of the second strip structures being parallel to each other; and a top structure, the top structure being located on the first active region, the top structure being made of a same material as the second active region, in a direction perpendicular to a top surface of the first active region, a thickness of the top structure being equal to a thickness of the second active region, the top structure having a side section, the side section being a plane, one side surface forming the mapping right angle being in a same plane as the side section, and the other side surface forming the mapping right angle being perpendicular to a plane where the side section is located.

BRIEF DESCRIPTION OF DRAWINGS

One or more embodiments are exemplarily described by using figures that are corresponding thereto in the accompanying drawings. Unless otherwise particularly stated, the figures in the accompanying drawings do not constitute a scale limitation.

DESCRIPTION OF EMBODIMENTS

In order to make the objectives, technical solutions and advantages of the embodiments of the present application clearer, various embodiments of the present application will be described below in detail with reference to the drawings. However, those of ordinary skill in the art may understand that, in the embodiments of the present application, numerous technical details are set forth in order to enable a reader to better understand the present application. However, the technical solutions claimed in the present application can be implemented without these technical details and various changes and modifications based on the embodiments below.

FIG. 1 to FIG. 17 are schematic structural diagrams corresponding to steps of a semiconductor structure manufacturing method according to an embodiment of the present application. The semiconductor structure manufacturing method includes the following steps.

Figure 1:
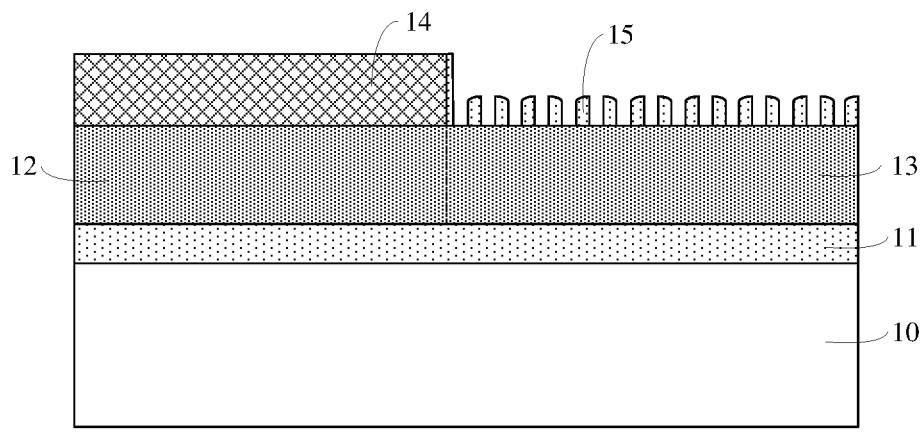
FIG. 1 to FIG. 17 are schematic structural diagrams corresponding to steps of a semiconductor structure manufacturing method according to an embodiment of the present application.
Figure 2:
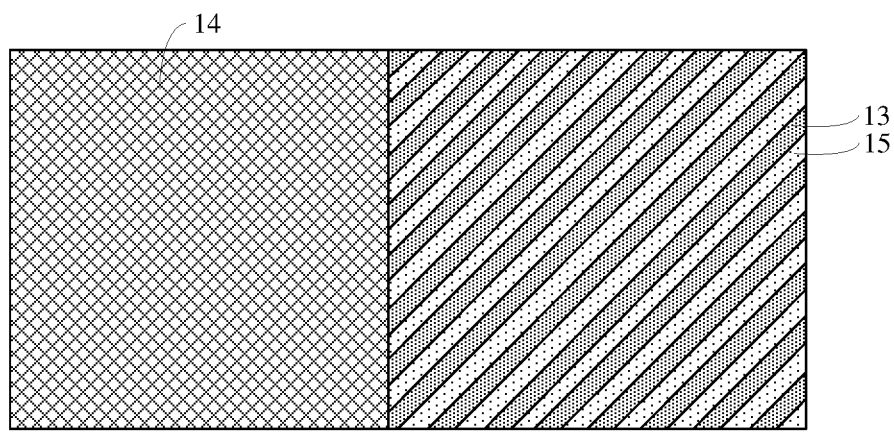

Referring to FIG. 1 and FIG. 2, a first film layer 10 and a second film layer 11 sequentially stacked, a base substrate 12 and a substrate 13 located on the second film layer 11, a sacrificial layer 14 stacked on the base substrate 12 and an initial mask layer 15 located on the substrate 13 are provided.

In this embodiment, the base substrate 12 and the substrate 13 are different parts of a same base. The base substrate 12 is located in a peripheral circuit region. The substrate 13 is located in a central array region. The base substrate 12 is connected to the substrate 13. The base substrate 12 is made of a same material as the substrate 13. In a direction perpendicular to a top surface of the base substrate 12, a thickness of the base substrate 12 is equal to a thickness of the substrate 13. Further, the top surface of the base substrate 12 is flush with a top surface of the substrate 13, and a bottom surface of the base substrate 12 is flush with a bottom surface of the substrate 13.

In other embodiments, the structural relationship, the material relationship and the position relationship between the base substrate and the substrate may be adjusted in one of the following ways. Firstly, the base substrate and the substrate are two independent structures, that is, not an integral structure. Secondly, the base substrate and the substrate are two separate members; that is, there is no connection relationship between them. Thirdly, the base substrate is made of a different material from the substrate. Fourthly, the thickness of the base substrate is less than the thickness of the substrate, and more than half of the thickness of the substrate.

"The base substrate is made of a different material from the substrate" may include the following details. Firstly, the base substrate is made of a single material, or the base substrate is made of a uniform mixture of various materials. Secondly, in the direction perpendicular to the top surface of the base substrate, the base substrate may be divided into a plurality of film layers with at least two layers made of different materials. The material and the structure of the base substrate meet the following process requirements. In a same process step, when half the thickness of the substrate is etched by an etching agent, only part of the thickness of the base substrate is etched; that is, the base substrate is not etched through.

In addition, when the thickness of the base substrate 12 is not equal to the thickness of the substrate 13, the top surfaces or the bottom surfaces of the base substrate 12 and the substrate 13 may be flush with each other, or the top surfaces are not flush with each other and the bottom surfaces are not flush with each other.

In this embodiment, the initial mask layer 15 is composed of a plurality of initial strip structures arranged in parallel. An opening pattern of the initial mask layer 15 includes a plurality of strip openings arranged in parallel. The initial mask layer 15 is made of a same material as the second film layer 11, such as silicon dioxide. In other embodiments, the initial mask layer is made of a different material from the second film layer.

In this embodiment, the sacrificial layer 14 includes a plurality of film layers sequentially stacked in the direction perpendicular to the top surface of the base substrate 12. The arrangement of the sacrificial layer 14 is intended to protect the base substrate 12 in the process step of etching the substrate 13, so as to prevent damages to or etching of the base substrate 12. The sacrificial layer 14 may include a silicon hydroxide layer. In other embodiments, the sacrificial layer is a monolayer film layer.

Figure 3:
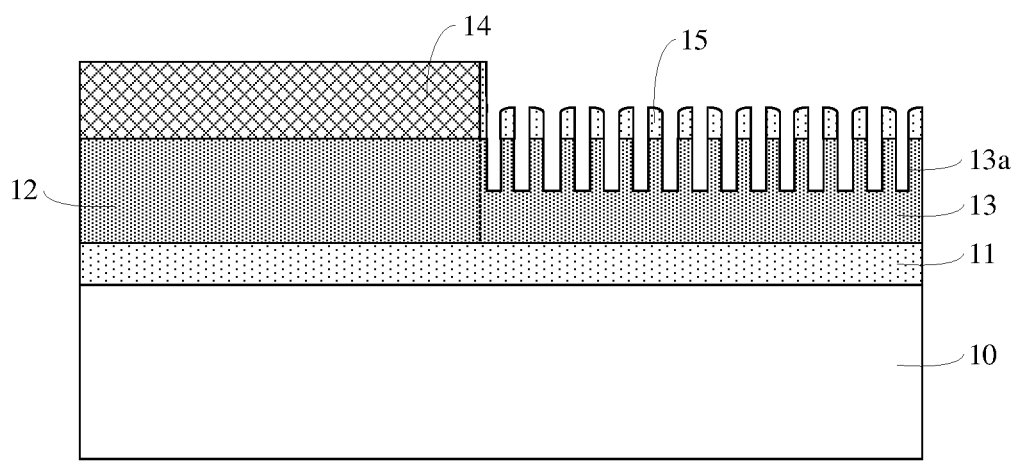

Referring to FIG. 3, the substrate 13 is etched, by using the initial mask layer 15 as a mask, to form the remaining substrate 13 with a preset thickness and a mapping mask layer 13a located on the remaining substrate 13.

The preset thickness refers to a thickness of a second active region required to be subsequently formed. The preset thickness may be adjusted in a certain range according to an actual requirement. "A certain range" means that the preset thickness should be greater than or equal to half the thickness of the base substrate 12. In this way, the base substrate 12 can be etched through to form a first active region through two etching process steps of etching an array region with the preset thickness to form the second active region.

In this embodiment, the preset thickness is half the thickness of the substrate 13 prior to etching. A remaining structure of the etched part of the substrate 13 serves as the mapping mask layer 13a. A thickness of the mapping mask layer 13a is equal to a thickness of the remaining substrate 13. An opening pattern of the mapping mask layer 13a is the same as the opening pattern of the initial mask layer 15. In this way, the base substrate 12 may be just etched through by using two etching processes of forming the second active region, which prevents damages of the etching processes to the second film layer 11 located below the base substrate 12.

Figure 4:
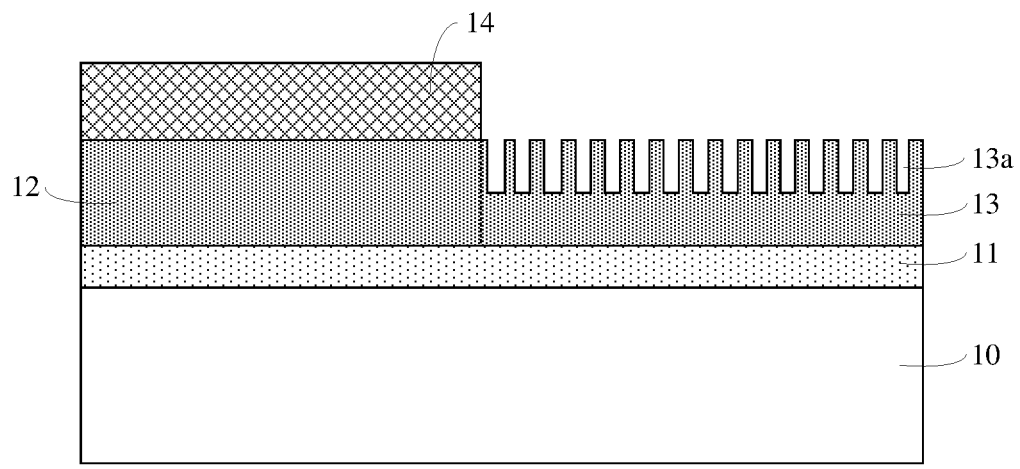
Figure 5:
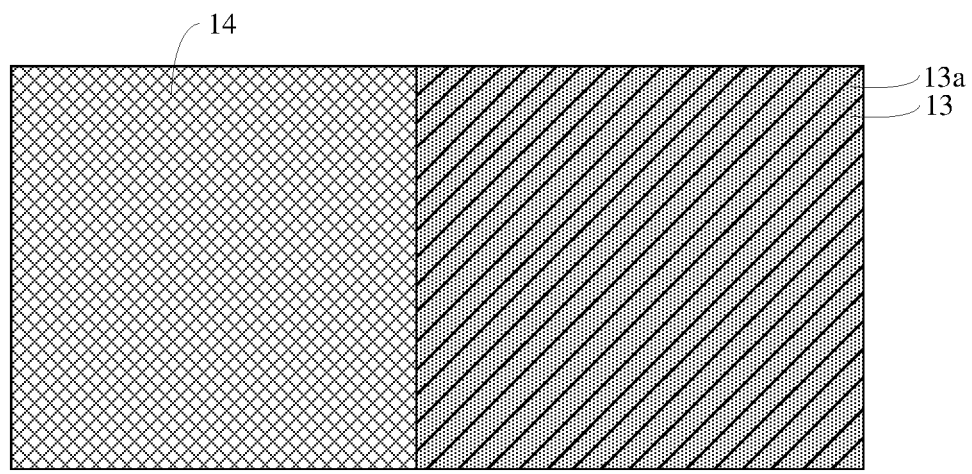

Referring to FIG. 4 and FIG. 5, the initial mask layer 15 (refer to FIG. 3) is removed after the mapping mask layer 13a is formed.

The initial mask layer 15 is made of a same material as the second film layer 11; therefore, if the opening pattern of the initial mask layer 15 is mapped onto part of the thickness of the substrate 13, and the initial mask layer 15 is removed after the mapping mask layer 13a is formed, that is, before the substrate 13 is etched through, an opening pattern the same as the opening pattern of the initial mask layer 15 can be etched on the remaining substrate 13, and damages of the removal process of the initial mask layer 15 to the second film layer 11 can be prevented.

Figure 6:
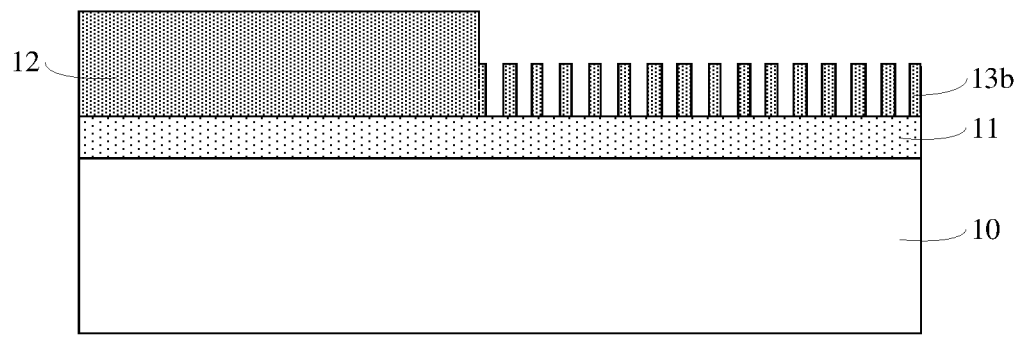
Figure 7:
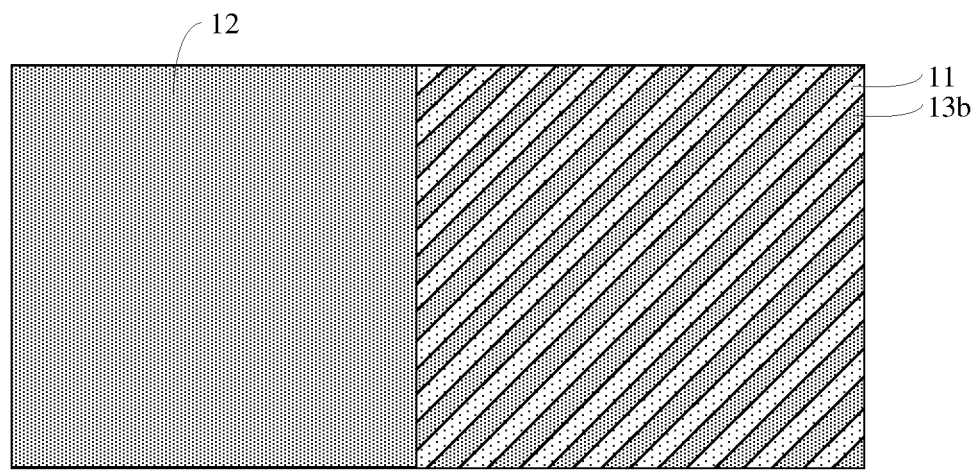

Referring to FIG. 6 and FIG. 7, after the initial mask layer 15 (refer to FIG. 3) is removed, the remaining substrate 13 is etched, by using the mapping mask layer 13a (FIG. 4) as a mask, to form an array region 13b.

In this embodiment, the array region 13b exposes the second film layer 11. The array region 13b has a same shape as the initial mask layer 15. The array region 13b is composed of a plurality of strip structures arranged in parallel. Since the base substrate 12 is connected to the substrate 13, the base substrate 12 is also connected to the array region 13b after the substrate 13 is etched to form the array region 13b. That is, the base substrate 12 is connected to at least one strip structure in the array region 13b.

In addition, the thickness of the mapping mask layer 13a is half the thickness of the substrate 13 prior to etching, and the thickness of the mapping mask layer 13a is equal to the thickness of the remaining substrate 13 subsequent to the etching; therefore, in the process of etching the remaining substrate 13 to expose the second film layer 11, the mapping mask layer 13a and the remaining substrate 13 exposed by the mapping mask layer 13a are synchronously etched by the etching agent. When the remaining substrate 13 is etched through to expose a surface of the second film layer 11, the mapping mask layer 13a is synchronously removed.

In addition, after the array region 13b is formed, the sacrificial layer 14 (refer to FIG. 4) is removed to facilitate simultaneous etching of the base substrate 12 and the array region 13b by using a subsequent etching process, so as to save costs of the etching process. Besides, a first opening pattern for etching the array region 13b and a second opening pattern for etching the base substrate 12 may also be formed respectively in different regions of a same mask plate, and then the base substrate 12 and the array region 13b are etched respectively through the same mask plate and the same etching process, which helps reduce a number of times of manufacturing and a number of blocks of the mask plate, thereby reducing manufacturing costs of the mask plate.

Figure 8:
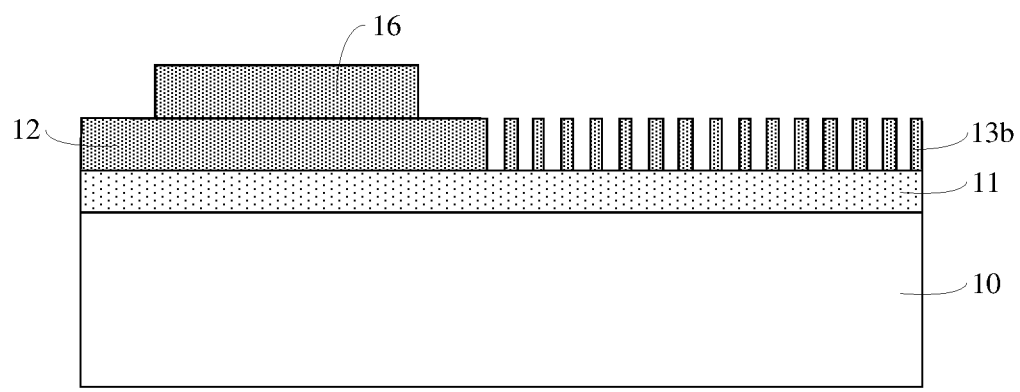
Figure 9:
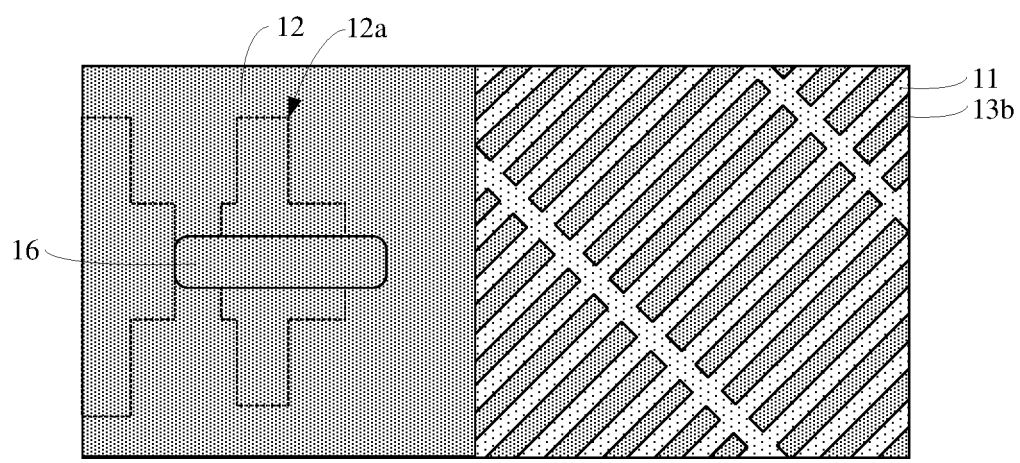

Referring to FIG. 8 and FIG. 9, the strip structure of the array region 13b is etched to form a plurality of discrete first strip structures (not marked), and part of the thickness of the base substrate 12 is etched to form a first mask structure 16.

In this embodiment, in a same process step, the strip structure is etched using a first opening pattern of the mask plate, and the base substrate 12 is etched using a second opening pattern of the same mask plate. In other embodiments, the strip structure is etched using a mask plate having a first opening pattern, and the base substrate is etched using another mask plate having a second opening pattern.

A remaining structure of the etched part of the base substrate 12 serves as the first mask structure 16. The first mask structure 16 is located on the remaining base substrate 12. The first mask structure 16 has a side plane perpendicular to a to-be-etched region 12a of the remaining base substrate 12. It is to be noted that, due to the distortion of a fillet during the etching, when the second opening pattern for forming the first mask structure 16 is a right-angled rectangle, a cross section of the first mask structure 16 finally formed is generally a rounded rectangle.

In this embodiment, the first mask structure 16 is of a strip structure, and the first mask structure 16 has two opposite side planes. In other embodiments, a number and positions of the side planes of the first mask structure may be set according to an actual requirement. For example, the first mask structure has one side plane or two adjacent side planes.

Since the first mask structure 16 and the first strip structure are formed using a same etching process, in a direction perpendicular to a top surface of the first mask structure 16, a thickness of the first mask structure 16 is equal to a thickness of the first strip structure. That is, the thickness of the first mask structure 16 is equal to a thickness of the array region 13b.

Figure 10:
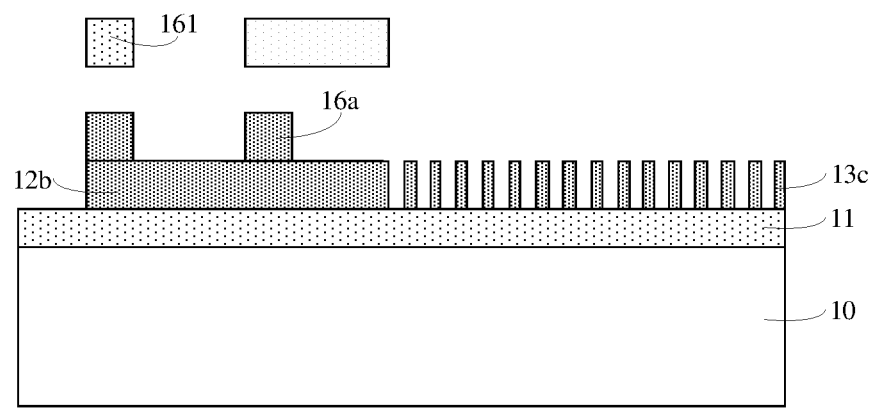
Figure 11:
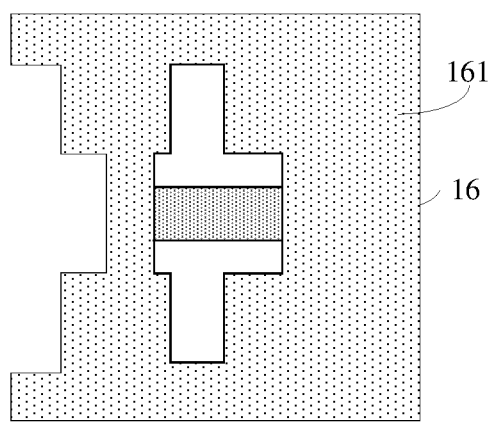
Figure 12:
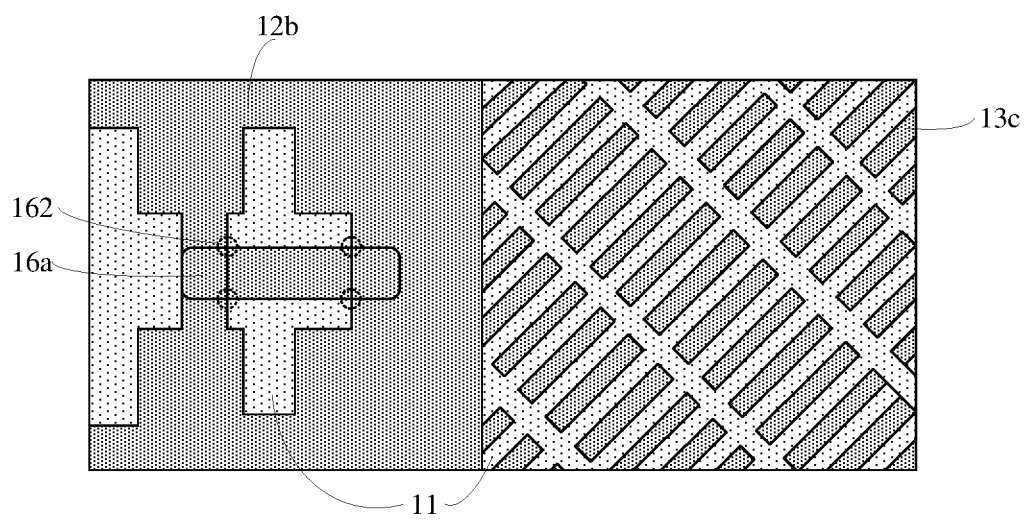

Referring to FIG. 10 to FIG. 12, the first strip structure is etched to form a second active region 13c, and the remaining base substrate 12 (refer to FIG. 9) is etched to form a first active region 12b.

In this embodiment, the first strip structure is etched to form a plurality of discrete second strip structures, and the second strip structures constitute the second active region 13c.

In a same step of etching the first strip structure, a second mask layer 161 is provided, in a direction perpendicular to a top surface of the second mask layer 161, an opening pattern of the second mask layer 161 exposes the to-be-etched region 12a (refer to FIG. 9) and exposes the side plane of the first mask structure 16, and in a plane where the top surface of the first mask structure 16 is located, at least one right angle is formed between an orthographic projection of the side plane and an orthographic projection of the opening pattern of the second mask layer 161. The to-be-etched region 12a is etched, by using the second mask layer 161 and the first mask structure 16 as a mask, to form the first active region 12b. The first active region 12b has a mapping right angle 162 corresponding to the right angle. Since the second etching process of forming the second active region 13c is further configured to form the first active region 12b, there is no need to provide another independent etching process, thus helping further save process costs.

In this embodiment, in the plane where the top surface of the first mask structure 16 (refer to FIG. 9) is located, the orthographic projection of the side plane is perpendicular to and passes through at least one side of the orthographic projection of the opening pattern of the second mask layer 161. Since the fillet of the first mask structure 16 may expand during the etching, that is, the side plane is shortened due to erosion during the etching, a certain size is required to be reserved to ensure that the orthographic projection of the side plane is perpendicular to the side, so that during the etching of the remaining base substrate 12, the orthographic projection of the eroded side plane is always in contact with and perpendicular to the side to form the first active region 12b with the mapping right angle 162.

Further, the orthographic projection of the side plane is located on two opposite sides of the orthographic projection of the opening pattern, the orthographic projection of the side plane is perpendicular to and passes through at least two sides of the orthographic projection of the opening pattern, and the orthographic projection of the side plane and the orthographic projection of the opening pattern form two right angles. In this way, two mapping right angles 162 may be formed at the same time.

In this embodiment, the first mask structure 16 has two opposite side planes, and an orthographic projection of each of the side planes is perpendicular to and passes through two sides of the orthographic projection of the opening pattern. In this way, four mapping right angles 162 may be formed at the same time. In other embodiments, at least one right angle is formed between the orthographic projection of each of the side planes and the orthographic projection of the opening pattern.

In this embodiment, the opening pattern of the second mask layer 161 exposes two to-be-etched regions 12a located on two opposite sides of the first mask structure 16. In this way, the two to-be-etched region 12a may be etched through one opening pattern to form two blank regions with the mapping right angles 162. The blank region is defined by the first active region 12b, so as to reduce the manufacturing difficulty of the second mask layer 161. At the same time, the opening pattern of the second mask layer 161 may be regarded as a combined pattern for etching openings of different to-be-etched regions 12a. Due to the combination of the openings, some original right angles which may be distorted into the fillet are eliminated, and the fillet distortion problem is solved to some extent.

In addition, the thickness of the first mask structure 16 is the same as the thickness of the remaining base substrate 12, during the etching of the to-be-etched region 12a, the first mask structure 16 located between two opposite to-be-etched regions 12a is removed synchronously. The remaining first mask structure 16 serves as a top structure 16a. The top structure 16a has a side section 20 etched through a straight side of the second mask layer 161. The side section 20 is a plane.

Figure 13:
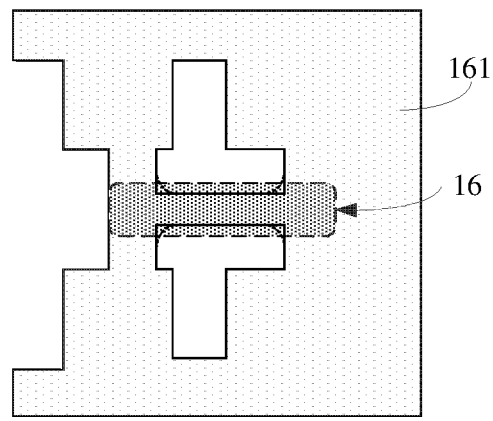
Figure 14:
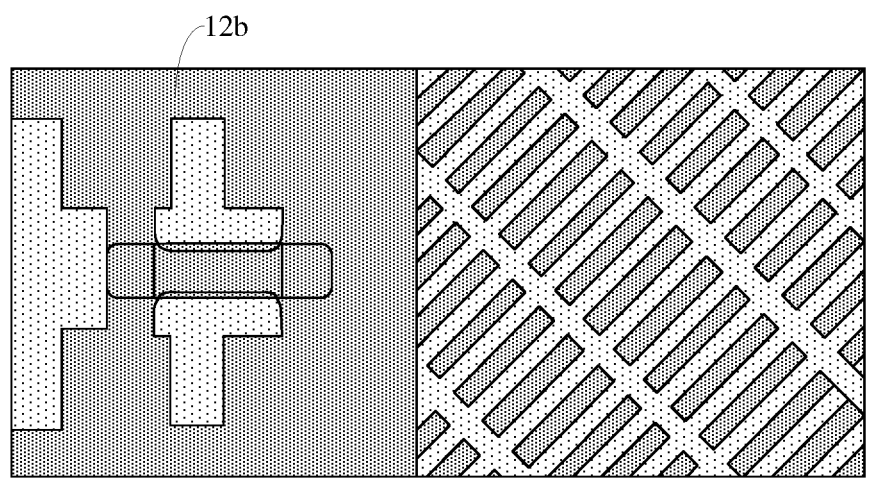

In other embodiments, referring to FIG. 13 and FIG. 14, the second mask layer includes two discrete opening subpatterns. Each of the opening subpatterns exposes one to-be-etched region and one side plane perpendicular to the to-be-etched region. The two to-be-etched regions located on two opposite sides of the first mask structure are etched through the two opening sub patterns of the second mask layer to form two blank regions with a mapping right angle.

Exposing the side plane of the first mask structure 16 means exposing at least part of the first mask structure 16 including the side plane. Since the right angle of the opening pattern of the second mask layer 161 may be distorted into a fillet during etching mapping, in order to ensure that the orthographic projection of the side plane intersects with an undistorted side to form a right angle, the first mask structure 16 should have a certain width in a direction perpendicular to the side plane. In other words, an overlapping region between the orthographic projection of the opening pattern of the second mask layer 161 and the orthographic projection of the first mask structure should have a certain width to ensure that the orthographic projection of the distorted fillet falls within a range of the orthographic projection of the first mask structure 16, so as to completely etch the to-be-etched region, to enable the first active region formed by removing the to-be-etched region to have a mapping right angle.

If the first mask structure 16 has a narrower width, or the overlapping region between the orthographic projection of the second mask layer and the orthographic projection of the first mask structure has a narrower width, the orthographic projection of the fillet may fall only partially into the orthographic projection of the first mask structure. As a result, the blank region formed by removing the to-be-etched region has a fillet.

Figure 15:
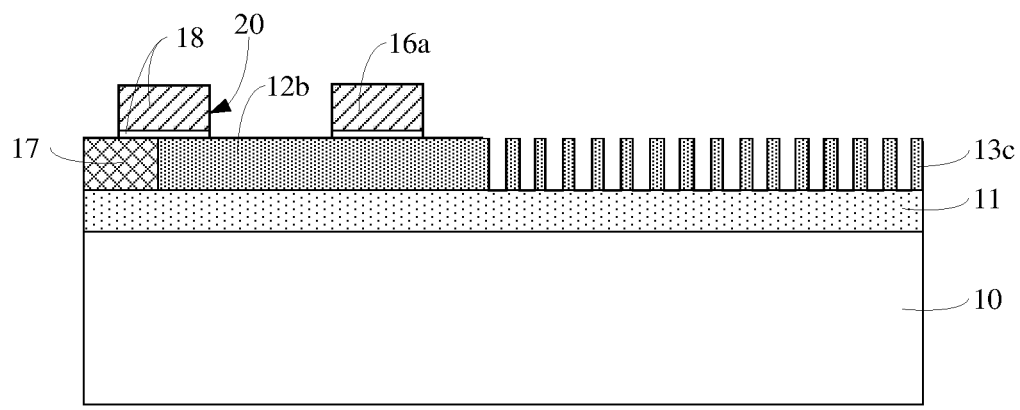
Figure 16:
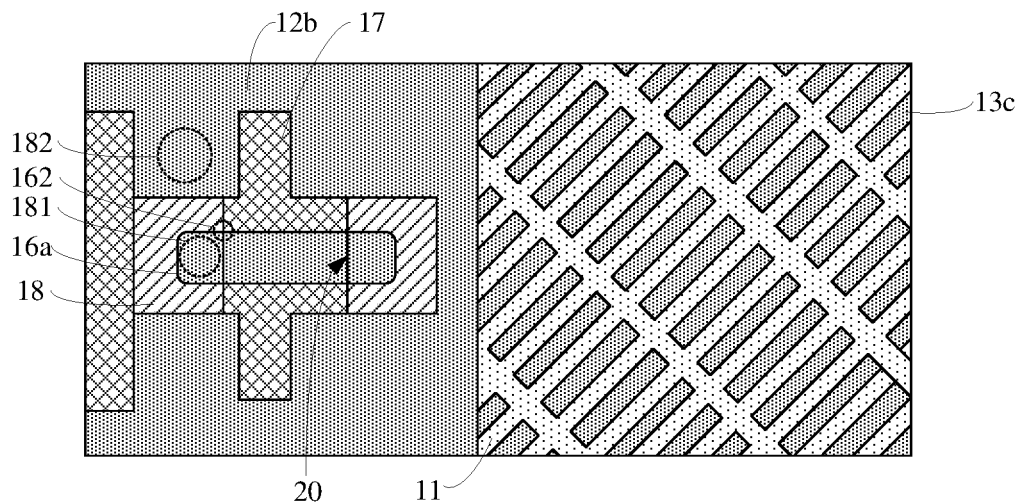

Referring to FIG. 15 and FIG. 16, an isolation structure 17 and a gate structure 18 are formed.

In this embodiment, after the first active region 12b is formed, the gate structure 18 is formed on the first active region 12b. In a plane where a top surface of the first active region 12b is located, an orthographic projection of the gate structure 18 is in contact with at least an orthographic projection of the mapping right angle 162. After the gate structure 18 is formed, ion implantation is performed, by using the gate structure 18 as a mask, on the first active region 12b to form a source region 181 and a drain region 182 located on two opposite sides of the gate structure 18. A region with the mapping right angle 162 defined by the first active region 12b isolates the source region 181 from the drain region 182.

It is to be noted that, dashed circles of the source region 181 and the drain region 182 are intended only to indicate their relative position relationship, which does not indicate that their ranges are limited to the dashed circles.

The first active region 12b has the remaining first mask structure 16 when the gate structure 18 is formed; therefore, a position of the gate structure 18 is limited by the remaining top structure 16a. In some embodiments, the gate structure 18 surrounds the remaining top structure 16a. In other embodiments, the top structure is removed after the first active region is formed.

In this embodiment, before the gate structure 18 is formed, the isolation structure 17 filling up the blank region is further required to be formed, so that the gate structure 18 can be formed on a plane beyond the first active region 12b. In addition, in the process of forming the gate structure 18 by using the mask plate, due to contraction distortion of the orthographic projection of the mask plate, a length and a width of the gate structure 18 actually formed are often less than those of the mask plate. If the orthographic projection of the mask plate is just in contact with the orthographic projection of the mapping right angle 162, the gate structure 18 actually formed often cannot contact with the orthographic projection of the mapping right angle 162. Therefore, in the present application, an orthographic projection of a mask layer for forming the gate structure 18 includes the mapping right angle 162, so as to ensure that the gate structure 18 actually formed effectively isolates the orthographic projection of the first active region 12b and ensure that the source region and the drain region formed by ion implantation are effectively isolated by the isolation structure 17, thereby preventing a leakage current caused by communication between the source region and the drain region.

In some embodiments, a process step of forming the gate structure 18 includes: forming a dielectric film and a conductive film sequentially stacked, the dielectric film covering part of the top surface of the first active region 12b and part of a top surface of the isolation structure 17; providing a third mask layer, in the plane where the top surface of the first active region 12b is located, an orthographic projection of the third mask layer partially overlapping with an orthographic projection of the first active region 12b and having an overlapping region with an orthographic projection of the isolation structure 17, and the overlapping region including the orthographic projection of the mapping right angle 162; and sequentially etching, by using the third mask layer as a mask, the conductive film and the dielectric film to form the gate structure 18.

Purposes of forming the mapping right angle and the overlapping region including the mapping right angle are illustrated below by a counter-example.

Figure 17:
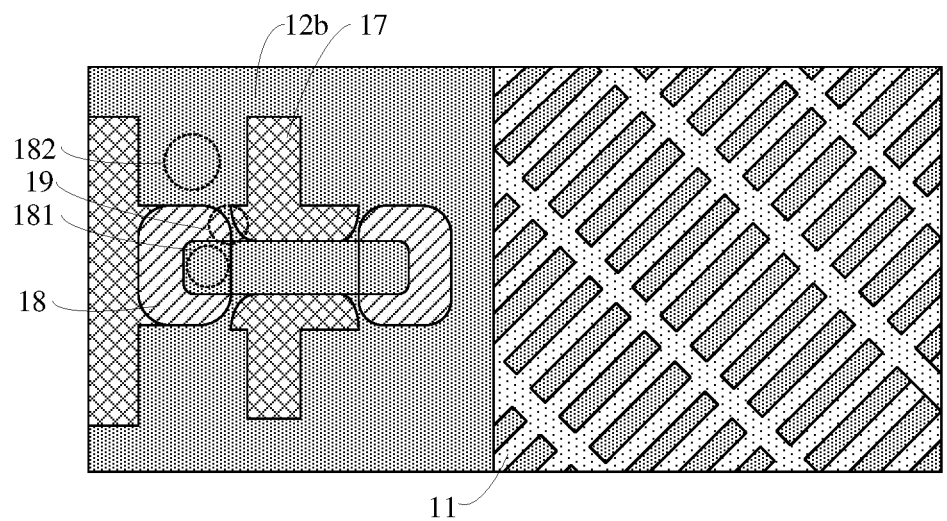

Referring to FIG. 17, if the blank region is filleted and/or the gate structure 18 contracts, an exposed region 19 between the isolation structure 17 and the gate structure 18 may be formed. The exposed region 19 is part of the first active region 12b. When the source region 181 and the drain region 182 are formed by using the gate structure 18 as a mask, since the gate structure 18 does not cover a surface of the exposed region 19, the exposed region 19 may also be doped with doped ions and then communicated with the source region 181 and the drain region 182 located on the two opposite sides of the gate structure 18, resulting in a leakage current.

In this embodiment, the first mask structure is formed by using a first etching process of forming the second active region, and no additional etching process is needed; at the same time, different opening patterns may be arranged in different regions of a same mask plate, so as to form the first strip structure and the first mask structure respectively by using the same etching process and the same mask plate without providing another independent mask plate. This helps reduce manufacturing costs of the first active region.

Correspondingly, an embodiment of the present application further provides a semiconductor structure, which may be manufactured with the above semiconductor structure manufacturing method.

Referring to FIG. 15 and FIG. 16, the semiconductor structure includes: a first active region 12b and a second active region 13c, the first active region 12b being made of a same material as the second active region 13c, the first active region 12b having a mapping right angle 162, the second active region 13c being composed of a plurality of second strip structures arranged in an array, extension directions of at least four of the second strip structures overlapping with one another, and extension directions of at least two of the second strip structures being parallel to each other; and a top structure 16a, the top structure 16a being located on the first active region 12b, the top structure 16a being made of a same material as the second active region 13c, in a direction perpendicular to a top surface of the first active region 12b, a thickness of the top structure 16a being equal to a thickness of the second active region 13c, the top structure 16a having a side section 20, the side section 20 being a plane, one side surface forming the mapping right angle 162 being in a same plane as the side section 20, and the other side surface forming the mapping right angle 162 being perpendicular to a plane where the side section 20 is located.

In this embodiment, in the direction perpendicular to the top surface of the first active region 12*b*, a thickness of the first active region 12*b* is equal to the thickness of the top structure 16*a*, a bottom surface of the first active region 12*b* is in a same plane as a bottom surface of the second active region 13*c*, and the first active region 12*b* is connected to at least one of the second strip structures of the second active region 13*c*.

Further, the semiconductor structure further includes: a gate structure 18, the gate structure 18 being located on the first active region 12*b*, and in a plane where the top surface of the first active region 12*b* is located, an orthographic projection of the gate structure 18 being in contact with at least an orthographic projection of the mapping right angle 162; and a source region 181 and a drain region 182, the source region 181 and the drain region 182 being located in the first active region 12*b* on two opposite sides of the gate structure 18, and a region with the mapping right angle 162 defined by the first active region 12*b* isolating the source region 181 from the drain region 182.

In addition, the semiconductor structure further includes: an isolation structure 17, the isolation structure 17 filling up the region with the mapping right angle 162 defined by the first active region 12*b*, and in the plane where the top surface of the first active region 12*b* is located, an orthographic projection of the gate structure 18 having an overlapping region with an orthographic projection of the isolation structure 17, and the overlapping region including the orthographic projection of the mapping right angle 162.

This embodiment provides a new semiconductor structure. The semiconductor has a mapping right angle, thereby helping reduce a leakage current of the semiconductor structure.

Those of ordinary skill in the art may understand that the above implementations are specific embodiments for implementing the present application. However, in practical applications, various changes in forms and details may be made thereto without departing from the spirit and scope of the present application. Any person skilled in the art can make respective changes and modifications without departing from the spirit and scope of the present application. Therefore, the protection scope of the present application should be subject to the scope defined by the claims.

What is claimed is:

1. A semiconductor structure manufacturing method, comprising:
   providing a base substrate and an array region, the array region being composed of a plurality of strip structures arranged in parallel, the base substrate being made of a same material as the array region, a top surface of the base substrate being parallel to a top surface of the array region, and in a direction perpendicular to the top surface of the base substrate, a thickness of the base substrate being greater than a thickness of the array region;
   etching the strip structure to form a plurality of discrete first strip structures; in a same process step of etching the array region, etching the base substrate with partial thickness to form a first mask structure, the first mask structure being located on the remaining base substrate, the first mask structure having a side plane, and the side plane being perpendicular to a to-be-etched region of the remaining base substrate;
   providing a second mask layer, in a direction perpendicular to a top surface of the second mask layer, an opening pattern of the second mask layer exposing the to-be-etched region and the side plane, and in a plane where a top surface of the first mask structure is located, at least one right angle being formed between an orthographic projection of the side plane and an orthographic projection of the opening pattern of the second mask layer;
   etching, by using the second mask layer and the first mask structure as a mask, the to-be-etched region to form a first active region, the first active region having a mapping right angle corresponding to the right angle; and
   etching the first strip structure to form a plurality of discrete second strip structures, the second strip structures constituting a second active region.

2. The semiconductor structure manufacturing method according to claim 1, wherein the thickness of the base substrate is twice the thickness of the array region.

3. The semiconductor structure manufacturing method according to claim 2, wherein in a same process step of etching the to-be-etched region, the first strip structure is etched.

4. The semiconductor structure manufacturing method according to claim 1, wherein in a same process step of etching the to-be-etched region, the first strip structure is etched.

5. The semiconductor structure manufacturing method according to claim 1, wherein in the plane where the top surface of the first mask structure is located, the orthographic projection of the side plane is perpendicular to and passes through at least one side of the orthographic projection of the opening pattern.

6. The semiconductor structure manufacturing method according to claim 4, wherein the orthographic projection of the side plane is located on two opposite sides of the orthographic projection of the opening pattern, the orthographic projection of the side plane is perpendicular to and passes through at least two sides of the orthographic projection of the opening pattern, and two right angles are formed between the orthographic projection of the side plane and the orthographic projection of the opening pattern.

7. The semiconductor structure manufacturing method according to claim 1, wherein the first mask structure has two opposite side planes, and at least one right angle is formed between an orthographic projection of each of the side planes and the orthographic projection of the opening pattern.

8. The semiconductor structure manufacturing method according to claim 1, wherein the base substrate is connected to at least one of the second strip structures.

9. The semiconductor structure manufacturing method according to claim 8, wherein the process step of providing a base substrate and an array region comprises:
   providing the base substrate and a substrate connected to each other, the top surface of the base substrate being parallel to a top surface of the substrate, the base substrate being made of a same material as the substrate, and in the direction perpendicular to the top surface of the base substrate, the thickness of the base substrate being equal to a thickness of the substrate;
   providing an initial mask layer, an opening pattern of the initial mask layer comprising a plurality of strip openings arranged in parallel;
   etching, by using the initial mask layer as a mask, half the thickness of the substrate to form a mapping mask layer located on the remaining substrate, an opening pattern of the mapping mask layer being the same as the opening pattern of the initial mask layer;

removing the initial mask layer after the mapping mask layer is formed; and etching, by using the mapping mask layer as a mask, the remaining substrate to form the array region after the initial mask layer is removed.

10. The semiconductor structure manufacturing method according to claim 9, subsequent to the step of forming a first active region, further comprising:

forming a gate structure on the first active region, in a plane where a top surface of the first active region is located, an orthographic projection of the gate structure being in contact with at least an orthographic projection of the mapping right angle; and performing, by using the gate structure as a mask, ion implantation on the first active region to form a source region and a drain region located on two opposite sides of the gate structure, a region with the mapping right angle defined by the first active region isolating the source region from the drain region.

11. The semiconductor structure manufacturing method according to claim 10, prior to the step of forming a gate structure, further comprising: forming an isolation structure, the isolation structure filling up the region with the mapping right angle defined by the first active region; and a process step of forming a gate structure comprising:

forming a dielectric film and a conductive film sequentially stacked, the dielectric film covering part of the top surface of the first active region and part of a top surface of the isolation structure;

providing a third mask layer, in the plane where the top surface of the first active region is located, an orthographic projection of the third mask layer partially overlapping with an orthographic projection of the first active region and having an overlapping region with an orthographic projection of the isolation structure, and the overlapping region comprising the orthographic projection of the mapping right angle; and sequentially etching, by using the third mask layer as a mask, the conductive film and the dielectric film to form the gate structure.

12. The semiconductor structure manufacturing method according to claim 1, wherein the first mask structure is removed after the first active region is formed.

13. The semiconductor structure manufacturing method according to claim 1, subsequent to the step of forming a first active region, further comprising:

forming a gate structure on the first active region, in a plane where a top surface of the first active region is located, an orthographic projection of the gate structure being in contact with at least an orthographic projection of the mapping right angle; and performing, by using the gate structure as a mask, ion implantation on the first active region to form a source region and a drain region located on two opposite sides of the gate structure, a region with the mapping right angle defined by the first active region isolating the source region from the drain region.

14. A semiconductor structure, comprising:

a first active region and a second active region, the first active region being made of a same material as the second active region, the first active region having a mapping right angle, the second active region being composed of a plurality of second strip structures arranged in an array, extension directions of at least four of the second strip structures overlapping with one another, and extension directions of at least two of the second strip structures being parallel to each other; and a top structure, the top structure being located on the first active region, the top structure being made of a same material as the second active region, in a direction perpendicular to a top surface of the first active region, a thickness of the top structure being equal to a thickness of the second active region, the top structure having a side section, the side section being a plane, one side surface forming the mapping right angle being in a same plane as the side section, and the other side surface forming the mapping right angle being perpendicular to a plane where the side section is located.

15. The semiconductor structure according to claim 14, wherein in the direction perpendicular to the top surface of the first active region, a thickness of the first active region is equal to the thickness of the top structure.

16. The semiconductor structure according to claim 15, wherein the first active region is connected to at least one of the second strip structures.

17. The semiconductor structure according to claim 14, wherein the first active region is connected to at least one of the second strip structures.

18. The semiconductor structure according to claim 14, further comprising:

a gate structure, the gate structure being located on the first active region, and in a plane where the top surface of the first active region is located, an orthographic projection of the gate structure being in contact with at least an orthographic projection of the mapping right angle; and a source region and a drain region, the source region and the drain region being located in the first active region on two opposite sides of the gate structure, and a region with the mapping right angle defined by the first active region isolating the source region from the drain region.

19. The semiconductor structure according to claim 18, further comprising:

an isolation structure, the isolation structure filling up the region with the mapping right angle defined by the first active region, and in the plane where the top surface of the first active region is located, an orthographic projection of the gate structure having an overlapping region with an orthographic projection of the isolation structure, and the overlapping region comprising the orthographic projection of the mapping right angle.

* * * * *